Figure 1:
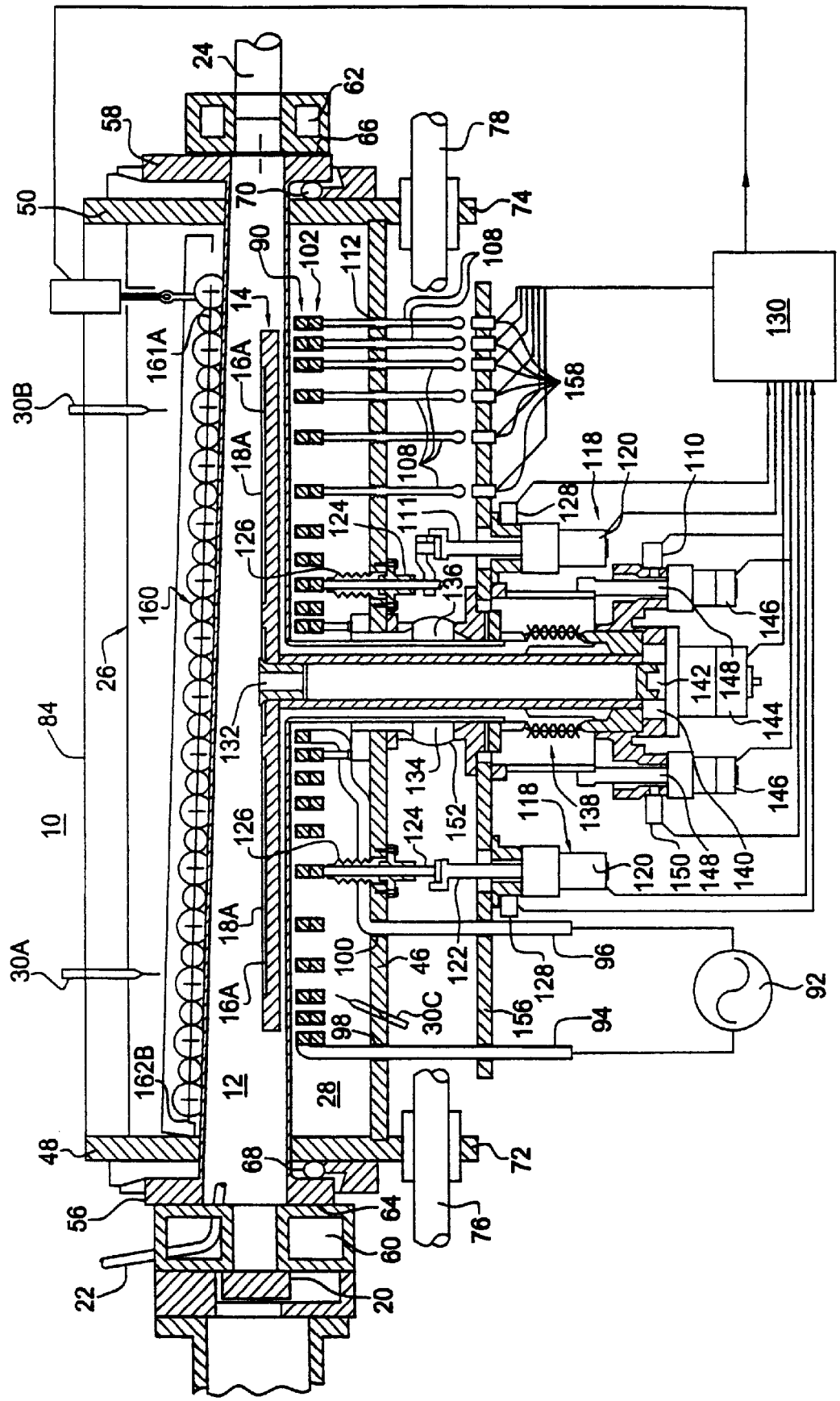

United States Patent [19]
Vincenzo et al.

[11] Patent Number: 6,022,412
[45] Date of Patent: Feb. 8, 2000

[54] EPITAXIAL REACTOR, SUSCEPTOR AND GAS-FLOW SYSTEM

[75] Inventors: Ogliari Vincenzo, Capergnanica; Preti Franco, Milan; Pozzetti Vittorio, Brugherio, all of Italy

[73] Assignee: LPE SPA, Bollate, Italy

[21] Appl. No.: 08/649,586

[22] PCT Filed: Sep. 14, 1995

[86] PCT No.: PCT/EP95/03626

§ 371 Date: Oct. 7, 1996

§ 102(e) Date: Oct. 7, 1996

[87] PCT Pub. No.: WO96/10659

PCT Pub. Date: Apr. 11, 1996

[30] Foreign Application Priority Data

Sep. 30, 1994 [IT] Italy .................................. MI94A1997

[51] Int. Cl.[7] ............................................. C23C 16/46
[52] U.S. Cl. .......................... 118/715; 118/724; 118/725; 118/729; 427/72; 427/248.1; 422/245
[58] Field of Search ..................................... 118/724, 729, 118/725; 422/245; 427/72, 248.1; 219/674, 675

[56] References Cited

U.S. PATENT DOCUMENTS

| | | | |
|---|---|---|---|
| 4,284,867 | 8/1981 | Hill et al. .......................... | 219/10.49 R |
| 4,714,594 | 12/1987 | Mircea ..................................... | 422/245 |
| 5,062,386 | 11/1991 | Christensen .............................. | 118/725 |
| 5,098,857 | 3/1992 | Kuech et al. ............................. | 437/107 |
| 5,244,694 | 9/1993 | Ozias ..................................... | 427/248.1 |
| 5,474,612 | 12/1995 | Sato et al. ............................... | 188/725 |
| 5,478,429 | 12/1995 | Komino et al. .......................... | 156/345 |
| 5,536,918 | 7/1996 | Ohkase et al. ........................... | 219/390 |

*Primary Examiner*—Bruce Breneman
*Assistant Examiner*—Norca L. Torres
*Attorney, Agent, or Firm*—Helfgott & Karas, P.C.

[57] ABSTRACT

An epitaxial reactor with a flat disc-shaped susceptor comprises a flat, substantially tubular quartz reaction chamber (12) containing a rotatable susceptor disk (14) having a plurality of recesses (16a–h) for housing a corresponding plurality of disc-shaped wafers (18a–h) of material to be processed, a tank (26) filled with flowing coolant liquid (28) surrounding the substantially tubular chamber (12), a primary supply inductor (90) substantially in the form of a flat spiral disposed outside the reaction chamber (12) in the lower portion of the tank (26) parallel to the susceptor disc (14) and having means (118) for modifying the distance between each individual turn of the primary inductor (90) and the susceptor disc, possibly a secondary inductor (102) formed by turns disposed parallel and closely coupled to the turns of the primary inductor (90), possibly means (158) for selectively connecting each turn of the primary inductor (90) to external loads according to a known technique or for selectively closing each turn of the secondary inductor, and means for providing maximum reflection on all of the walls of the chamber (complete gilding) and possibly means (160) for also providing continuously variable reflection on the face of the chamber disposed above the substrates.

31 Claims, 7 Drawing Sheets

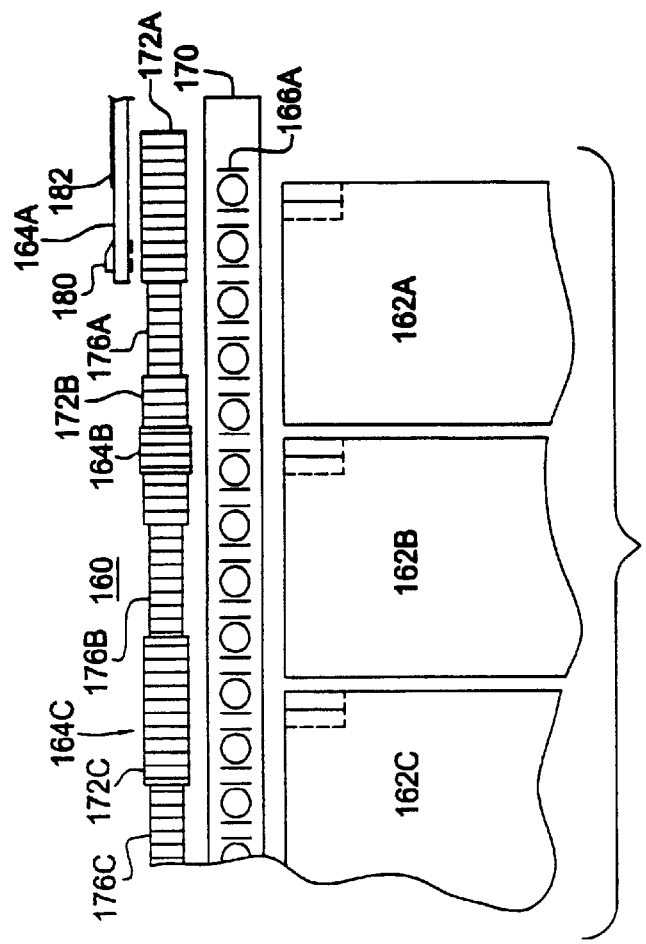
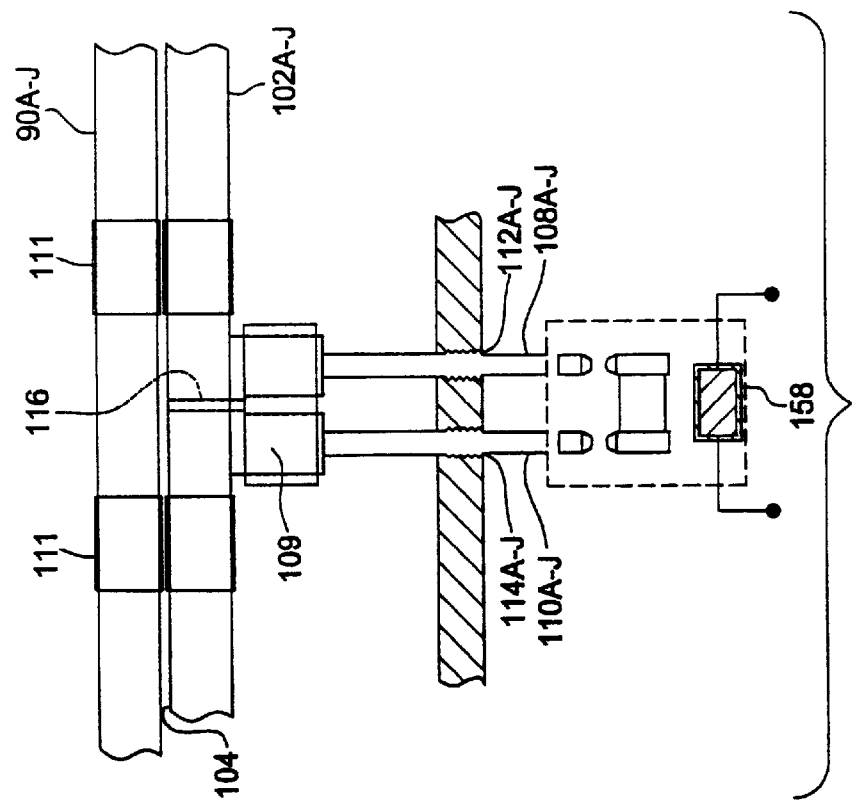

EPITAXIAL REACTOR, SUSCEPTOR AND GAS-FLOW SYSTEM

The present invention relates to a system for the chemical-vapour deposition (CVD) of semiconductor material on substrates.

Specifically, it relates to an epitaxial reactor for the chemical vapour deposition (CVD) of materials on a substrate and, in particular, on silicon substrates used in the manufacture of semiconductor components such as chips for integrated circuits.

More particularly, the present invention relates to an epitaxial reactor consisting of a small-volume tubular reaction chamber of substantially rectangular cross-section with a cold wall with an external cooler which may be with a flow of liquid coolant. The chamber contains a rotary disc-shaped susceptor which can house more than one substrate and the reaction gases, which are admitted through one or more inlets, flow through the chamber with a flow parallel to the substrates. The susceptor is heated by low-frequency induction (from 3,000 to 20,000 Hz) by means of a substantially flat spiral inductor disposed outside the reaction chamber; the inductor may have electro-mechanical means for individually varying the distance of one or more turns from the susceptor in order to vary the electromagnetic flux linkage of one or more turns of the inductor with the susceptor or, alternatively, may have devices described further below, and the reaction chamber has means deposited on the external walls of the reaction chamber or in any case located externally, for controlling the reflection of the energy radiated by the susceptor, the means being fixed or being movable or orientable by means of electro-mechanical or pneumatic actuators and the external means also possibly being adjustable in order to control their reflection continuously from a minimum value to a maximum value.

The most popular epitaxial reactors are of the batch type, that is, they can process a plurality of substrates simultaneously.

Generally, there are two configurations which are most popular at industrial level, bearing in mind the type of container or reaction chamber and susceptor used: the configuration with a vertical cylinder and a frusto-pyramidal susceptor, or the like, known in the art as the "barrel" configuration and the configuration with a flat disc-shaped susceptor in a suitable chamber, known in the art as the "pancake" configuration.

The systems for heating the susceptors of the aforementioned reactors can also be divided into two types: lamp heating and medium- or high-frequency induction heating.

The barrel system has a frusto-pyramidal susceptor on which the wafers are disposed in substantially vertical positions, the susceptor rotating about its own axis to ensure uniform heating and gas-flow, and the flow of reaction gases being substantially parallel to the surfaces of the wafers to be processed.

The barrel system uses a reaction chamber with small volumes and good performance and may have lamp or induction heating system which, in any case, remains outside the reaction chamber. The limitation of this system is that it is difficult to deposit uniform layers on large-diameter wafers (from 150 mm upwards), particularly as the number of wafers housed on the susceptor increases. This is due to the fact that the container is cylindrical and the cross-section through which the gas flows over the wafer is not uniform, causing a difference in the speed of the gas along the cross-section and a consequent non-uniformity of the layer deposited.

In the conventional "pancake" system, the susceptor consists of a rotary disc on which the wafers are disposed horizontally. The pancake system is characterized by a substantially hemispherical reaction chamber of large volume which is disposed above the susceptor and in which the gas reaches the wafers vertically. This reactor permits the deposition of layers which have good uniformity even on large-diameter wafers but which suffer from worse electrical characteristics because of the large volume of the chamber which requires long clearing times, leading to greater risk of contamination. Moreover, heating by electromagnetic induction necessitates the positioning of the inductor as close as possible to the susceptor and, in the conventional layout of pancake reactors, this means that the inductor has to be located inside the reaction chamber, thus seriously increasing the risk of contamination even when the inductor is suitably sealed. The horizontal position of the wafers, associated with the long cycle times, contributes to worse surface imperfections of the wafers.

The two types of heating are not exactly equivalent since, with lamp heating, the wafer is slightly hotter than the susceptor whereas, with induction heating, the wafer is cooler than the susceptor. The different direction of the temperature gradient involves substantial, difference in the production of commercially highly significant devices with very thick epitaxial layers.

In fact, without going into the advantages and disadvantages of the two heating systems, it can be said that lamp heating is reliable predominantly where small thicknesses (up to a maximum of 10–15 microns) are to be deposited, whereas the induction method is reliable where large thicknesses (up to 250 microns) are to be deposited, precisely because of the particular thermal gradient already mentioned between the wafer and the susceptor, although there are large areas of overlap of the suitability of the two methods.

It must be stated, however, that an excessive thermal gradient between the front and the rear of the wafer causes thermal stresses which permanently damage some regions of the wafer if a certain limit is exceeded.

This problem is typical of heaters with induction heating whilst it is almost non-existent in reactors with lamp heating.

The use of low-frequency induction has, however, permitted the use of techniques for reflecting the energy radiated by the susceptor, as taught, for example, in Italian patent No. 1,209,570, the proprietor of which is the Applicant of the present application, enabling the temperature gradient between the front and the rear of the wafer to be reduced with benefits to the crystallographic quality of the wafer so that, in most cases, performance substantially equivalent to that typical of reactors with lamps is achieved.

In the recent past reactors having a single wafer configuration, known as "monowafer" reactors with lamp heating have been offered on the market and can produce wafers with excellent uniformity regardless of the diameter of the wafer but permit poor productivity for wafers of small diameter. (In this connection, see, for example, the reactor described and claimed in U.S. Pat. No. 4,846,102, granted on Jul. 11th, 1989).

Since they are lamp reactors, monowafer reactors are in principle unsuitable for large coating thicknesses and, moreover, the further reduced productivity penalises the cost of the wafer.

The object of the invention is to provide a fully automated reactor designed specifically for depositing principally thick layers on large-diameter wafers with optimal quality characteristics and adequate productivity. The selection of induction technology achieves the thermal gradient between the wafer and the susceptor which is necessary for large thicknesses.

The main objectives to be achieved by the invention are:

in a configuration with a rotary disc-shaped susceptor, to keep a heating inductor as close as possible to the susceptor but positioned outside the reaction chamber in order to be out of contact with the chemical reagents circulating inside the reaction chamber;

to use a reaction chamber having a flat, tubular shape with two larger walls arranged substantially parallel to the end faces of the disc-shaped susceptor in order to have a reduced volume and a gas-flow parallel to the substrates, that is, with growth conditions partially like to those experienced in barrel reactors but without the problem of the non-uniform cross-section for the gas-flow;

to use novel techniques for the local control of the electromagnetic flux between the inductor and the susceptor by varying the linkage between each individual turn or set of turns and the susceptor in real time so as to optimize the transverse temperature profile in the susceptor in real time during the heating, deposition and cooling stages, in order to minimize thermal stresses;

to use the reflection towards the substrates of the energy radiated by the susceptor, possibly with the use of novel techniques for controlling this reflection so as to be able to vary it between a minimum value and a maximum value with the further additional possibility of adjustment to intermediate values in order to optimize the contribution of the reflection in response to on the thickness of the epitaxial layer and to reduce the cooling times by regulating the reflection to the minimum value.

In short, an epitaxial reactor which satisfies the aforementioned requirements comprises a flat disc-shaped susceptor having a plurality of seats for wafers of material to be processed, housed in a reaction chamber having the form of a flattened tube having two larger walls arranged substantially parallel to the end faces of the disc-shaped susceptor, the susceptor rotating about its principal axis and being heated by induction by an inductor, characterized in that the inductor is as close as possible to the susceptor but is located outside the reaction chamber and consists of a flat spiral parallel to an end face of the susceptor.

In one particular embodiment, the reactor is characterized in that the walls of the reaction chamber may converge in the direction of the principal gas-flow imposed by one or more inlets.

Alternatively, the susceptor may adopt a slight inclination to the reaction chamber.

In addition, the thickness of the disc-shaped susceptor is uniform from point to point.

Alternatively, the thickness of the disc-shaped susceptor is variable from point to point.

Moreover, the reaction chamber is cooled by immersion in coolant fluid such as, for example, water flowing through a pool, the inductor also being cooled by the same coolant fluid, by being completely immersed therein.

Alternatively, the reaction chamber is cooled by a shower of coolant fluid and the inductor is cooled by the same coolant fluid which enters as a shower and is collected in a pool disposed beneath the reaction chamber.

As a further alternative, the reaction chamber is cooled by air-circulation and the inductor, formed by solid conductors, is cooled by immersion in a mass of flowing water.

Also alternatively, the inductor is formed by hollow conductors enabling coolant fluid to circulate inside them.

The inductor in the form of a flat spiral is preferably constituted by a plurality of concentric flat circular turns connected in series to form a shape similar to a flat spiral.

The inductor is also preferably supported by movable supports which can be actuated by drive means to enable the distance between the inductor and the susceptor to be controlled, the actuation being detected by encoders connected to the drive means.

Alternatively, the movable supports actuated by the drive means act separately on each individual turn of the inductor enabling the distance between each individual turn and the susceptor disposed above it to be controlled separately so as consequently to control the currents induced in the susceptor by altering the distance between the turns and the susceptor.

In one particular embodiment, the individual turns of the inductor have taps for external connection to control members in order to draw current from the individual turns or to admit current thereto.

In particular, the control members connectible to the taps may be variable inductors for the regulable drawing of current from the turns, or variable capacitors for the regulable admission of current to the turns.

Alternatively, instead of the provision of taps on the turns of the inductor coil, a secondary coil may be provided, coupled closely to the primary inductor coil and consisting of concentric circular turns which are anchored tightly to the individual turns of the inductor and each of which terminates in connections to external members for connecting the individual turns to current regulators.

Alternatively, the turns of the secondary coil, which are anchored tightly to the turns of the inductor or primary coil, are made of conductive material having a different resistivity from that of the conductors of the primary coil so as to act as resistive loads when the turns are closed, for example, by means of contacts disposed outside regions of the reactor occupied by the coolant fluid.

The turns of the primary coil are preferably made of solid copper conductors and the turns of the secondary coil are made of solid conductors of Constantan or similar materials with high resistivity.

In a preferred embodiment of the present invention, the possibility is introduced of using techniques for reflecting the thermal energy radiated by the susceptor by depositing a fixed reflective layer on the external walls of the reaction chamber.

Alternatively, reflection is achieved by the arrangement, above the reaction chamber and facing the susceptor on the side housing the wafers under treatment, of a movable reflective layer which is adjustable in order to increase or decrease reflection, the wall facing the movable reflective layer being made transparent, and a reflective layer being retained on all of the remaining walls of the reaction chamber.

In particular, the reflective layer consists of a series of parallel strips arranged like the slats of a blind and bearing a highly reflective, shiny surface on one side and a highly absorbent, dull surface on the other side so as to reflect the thermal radiation when the reflective faces of the strips are turned towards the susceptor and to dissipate the thermal radiation when the absorbent faces of the strips are turned towards the susceptor.

More particularly, the aforesaid strips consist of metal strips gilded on one face and darkened on the other so as to reflect with the gilded face and to absorb with the darkened face.

One embodiment of these strips consists of strips of copper sheet gilded on one side and darkened by oxidation on the opposite side, the gilding and the darkening possibly being achieved by chemical methods.

In particular, both the gilding and the darkening by oxidation are achieved electrolytically.

Alternatively, the strips may be of anodized aluminium with one shiny face and one dull, darkened face.

The aforesaid strips with shiny, reflective faces and dull, darkened faces are preferably actuated by a mechanism which permits exposure of the reflective faces or of the darkened faces, or their adjustment to intermediate positions.

In particular, this mechanism consists of rotary shafts which are inserted in the strips and enable one face or the opposite face of the strip to be exposed.

A unison mechanism is preferably provided for enabling all of the strips to move simultaneously.

More preferably, the unison mechanism consists of a series of gears each of which is connected to a shaft for rotating a strip, and which are meshed with one another to permit simultaneous positioning of the strips on the desired side.

Alternatively, the unison mechanism consists of crank means which are connected to each shaft for rotating a strip and are moved by a rod which connects all of the cranks.

The strips are moved by a rotary actuator connected to the mechanism for moving the strips in unison.

Alternatively, the actuator may be of a type with reciprocating linear movement.

In a particularly preferred embodiment of the invention, a programmable logic controller is used to control the circulation of the coolant fluid, the spacing of the inductor from the susceptor, the connection of taps of the inductor to external current-regulating members, or the connection of taps of the secondary coil to external current regulating members or to contacts, and the positioning of the actuator of the strips with the reflecting or absorbent layer.

Figure 2:
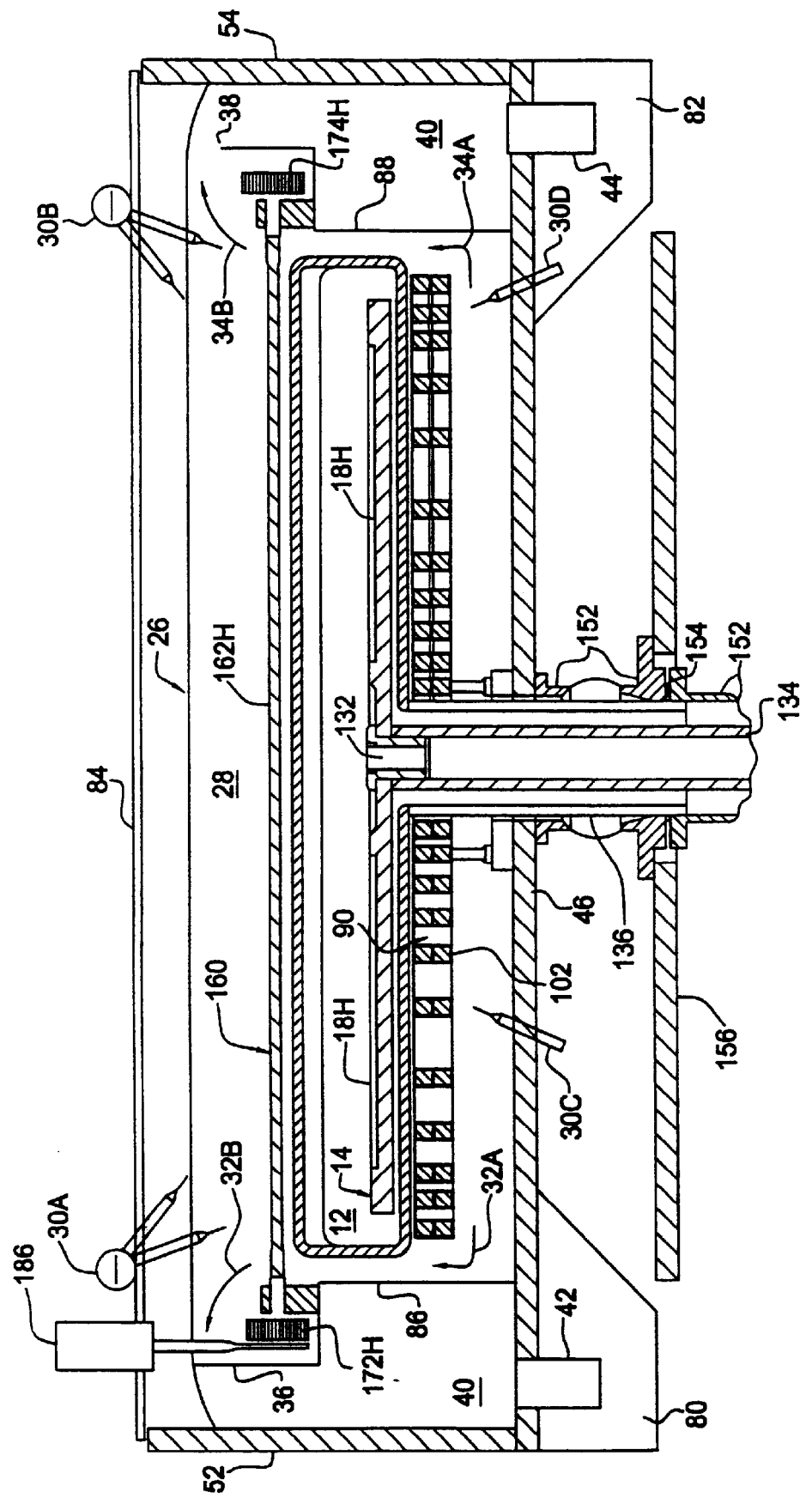
Figure 3:
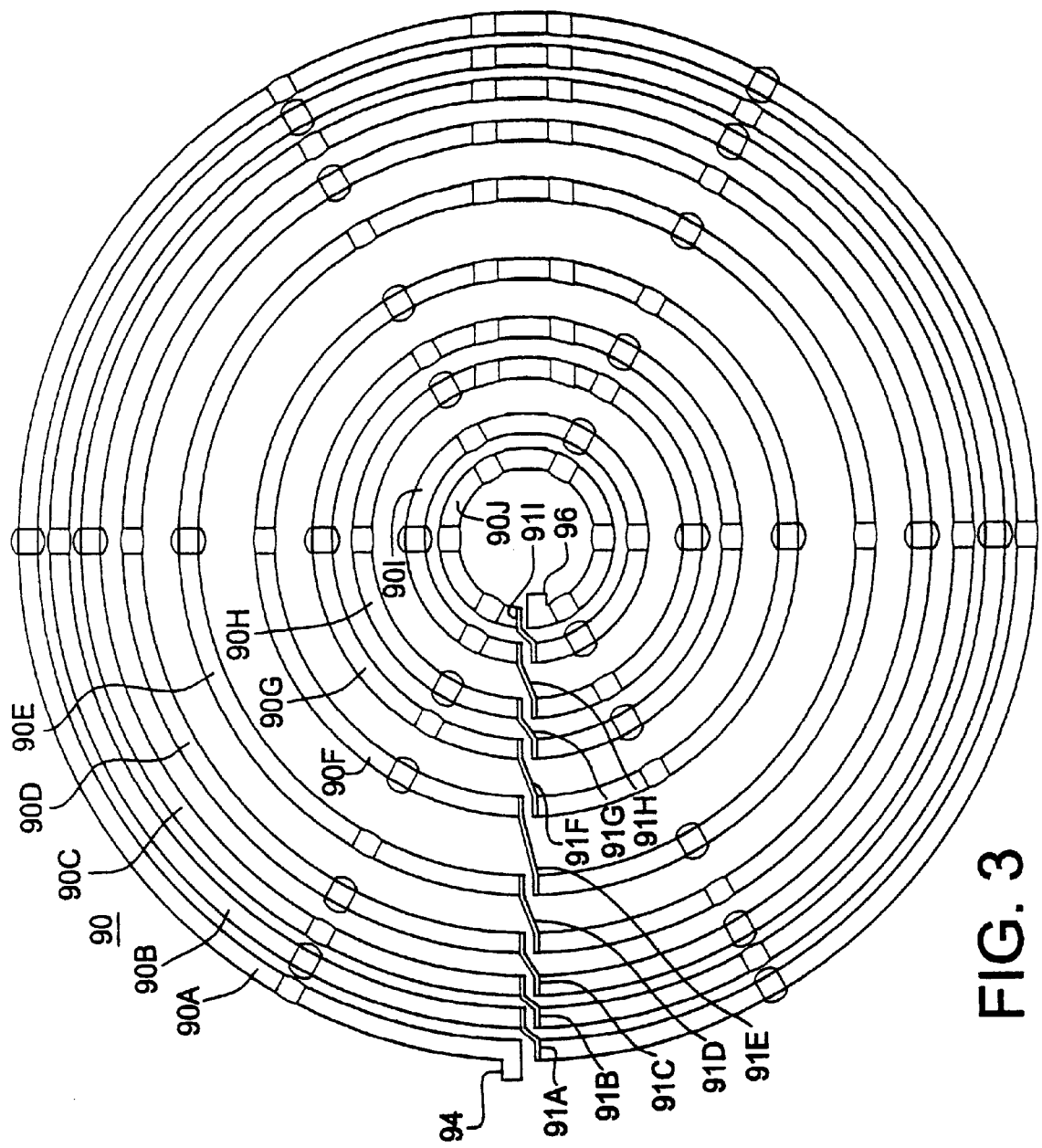
Figure 4:
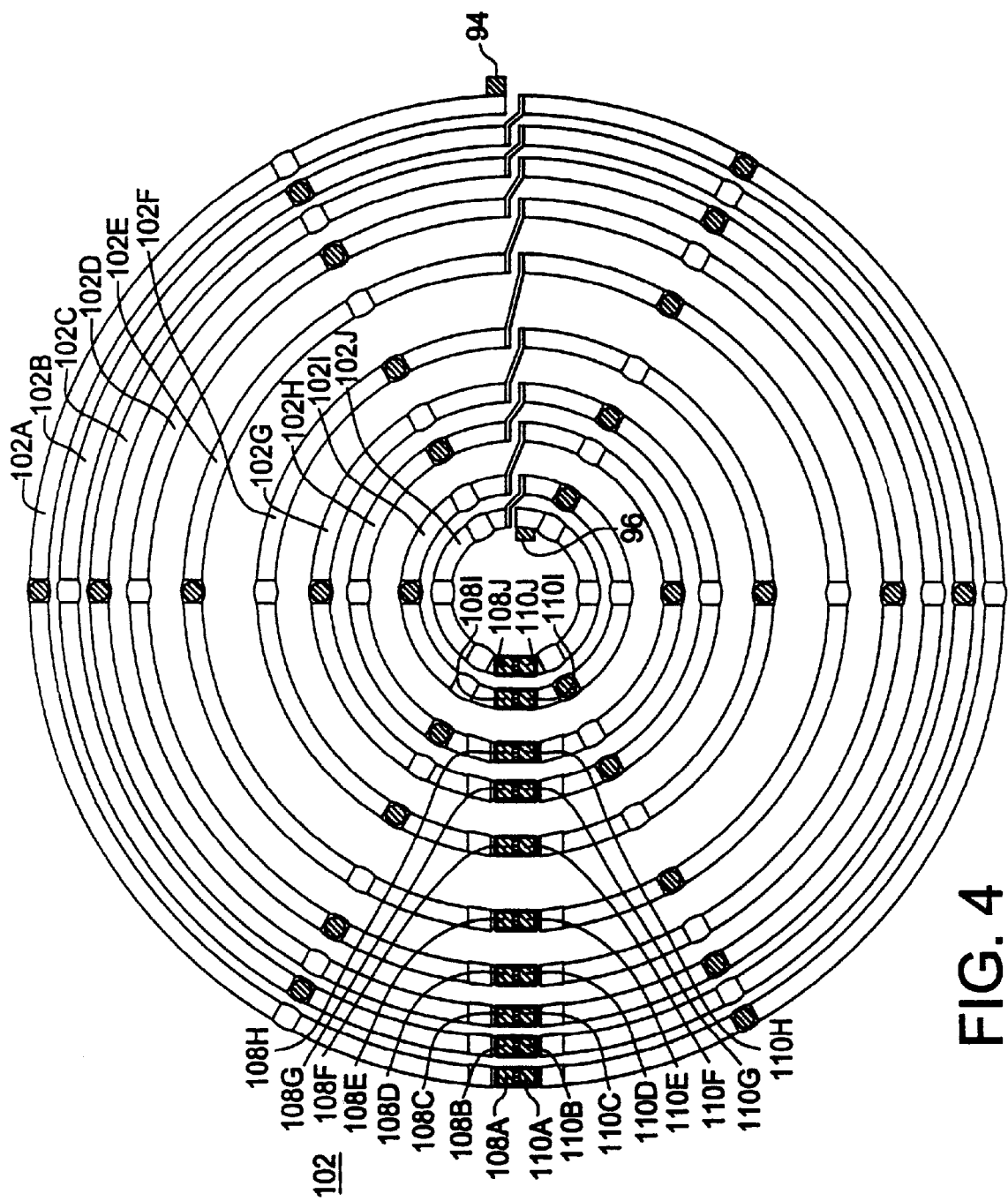
Figure 6:
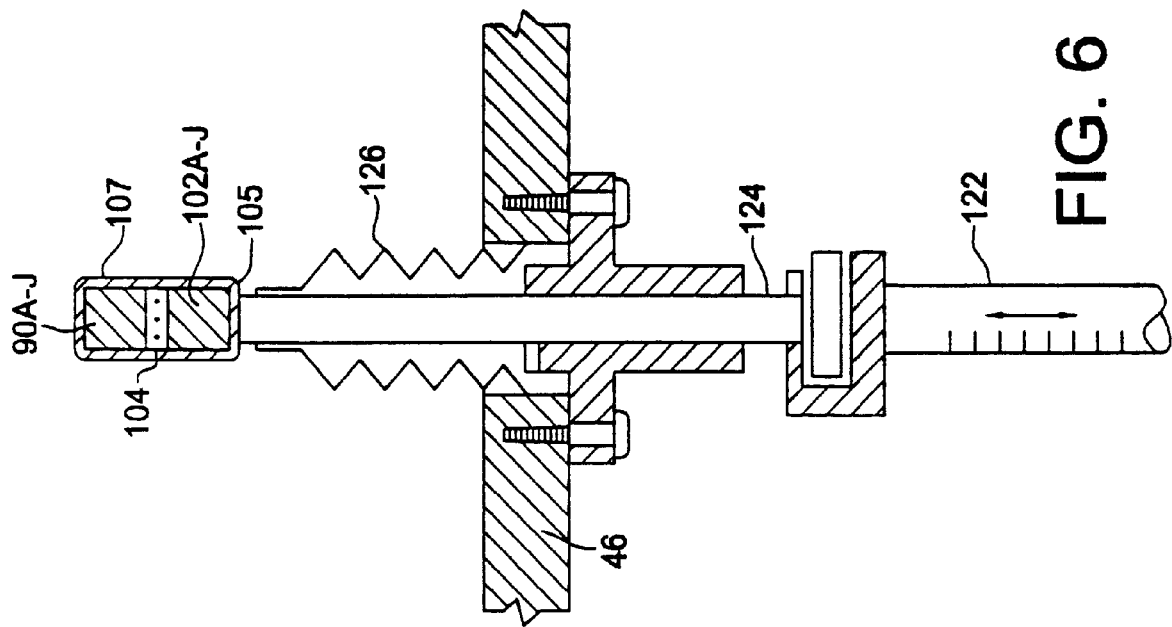
Figure 5:
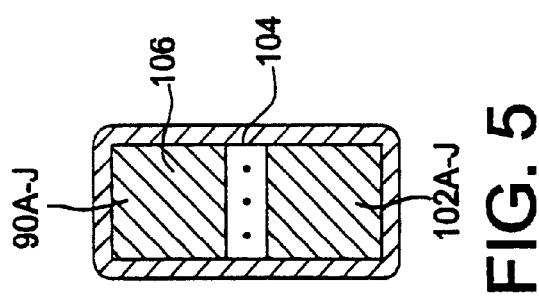
Figure 10:
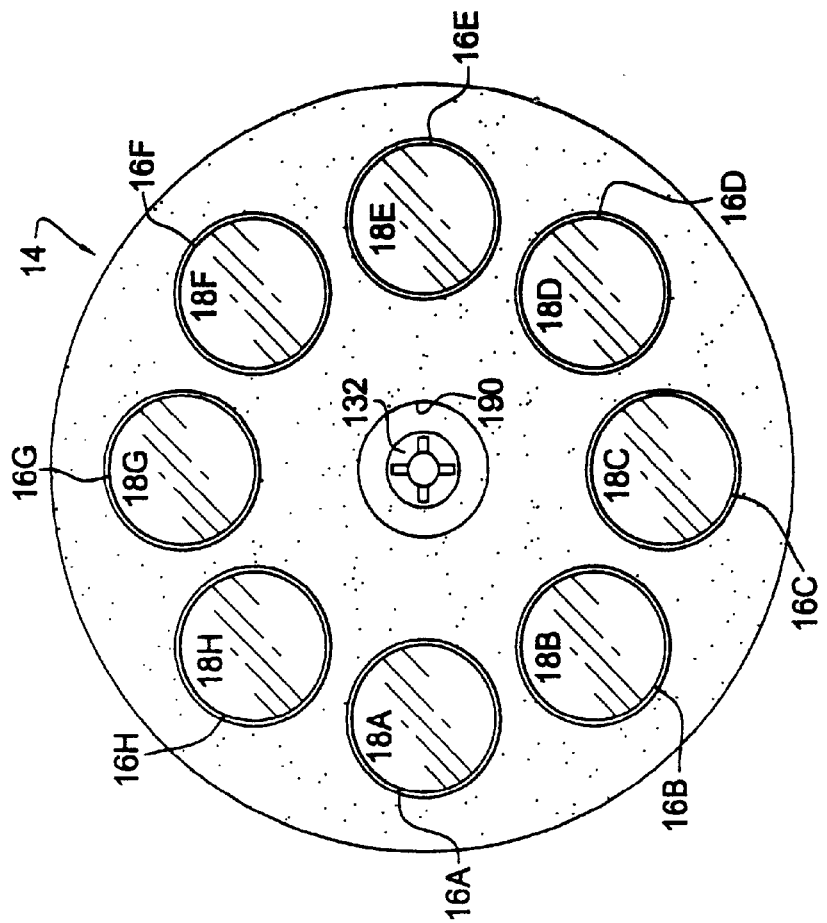
Figure 9:
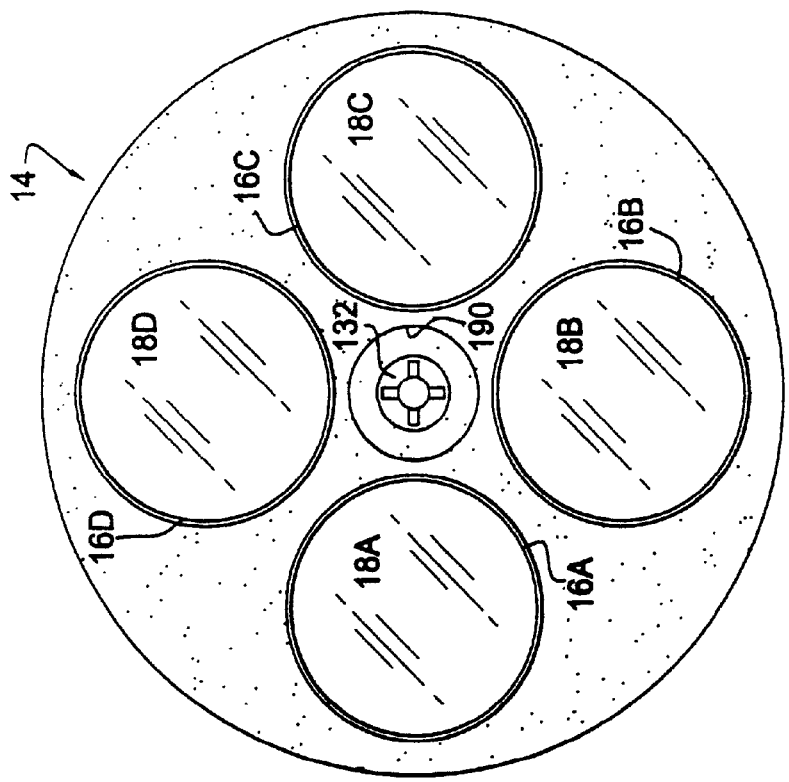

The features believed to be novel and inventive are defined precisely in the claims which form the concluding portion of the present specification. However, further features and advantages will become clearer from the following detailed description of a preferred embodiment thereof, given herein solely by way of non-limiting example, with reference to the appended drawings, in which:

FIG. 1 is a partially simplified schematic view showing, in longitudinal section, an epitaxial reactor with a disc-shaped susceptor including the improvements according to the present invention, FIG. 2 is a simplified schematic view showing the same epitaxial reactor as FIG. 1, in transverse section, FIG. 3 is a plan view of an assembly of a first or primary inductor and a secondary inductor used in the present invention, both in the form of flat spirals, FIG. 4 is a view from below of the same assembly as FIG. 3, showing better the secondary inductor which is also a flat spiral constituted by the a number of turns equal to the number of turns of the primary inductor and connected thereto, the turns of the secondary inductor being connectible in load circuits in order to load the corresponding turns of the primary inductor, FIG. 5 is a sectioned view showing, in particular the method of interconnecting a primary turn and a secondary turn, FIG. 6 is a sectioned view of an assembly of a primary turn and a secondary turn fixed to a movement means which varies the distance between the inductor assembly and the susceptor disposed above it, FIG. 7 is a partial view showing means of connecting and tapping a secondary turn to external circuits, FIG. 8 is a partial view showing a mechanism which serves to change the coefficient of reflection of a region above the susceptor from substantially wholly reflecting to substantially wholly absorbent, FIG. 9 is a plan view of a first embodiment of the susceptor according to the invention which can house four silicon wafers, and FIG. 10 is a plan view of another embodiment of the susceptor according to the invention which can house eight silicon wafers smaller than those shown in FIG. 9.

With reference to the drawings, it can be seen that an epitaxial reactor 10 according to the invention consists of a reaction chamber 12 of quartz or similar transparent, insulating material which is inert with respect to the chemical reagents and products which are used or are present, such as $H_2$, $SiCl_4$, $SiHCl_3$, HCl and the like, in the form of a tubular portion of fairly flat rectangular cross-section, containing a susceptor disc 14 having a plurality of recesses 16a–h for housing a corresponding plurality 18a–h of disc-shaped wafers of semiconductors such as silicon. The reaction chamber 12 has a door 20 for the introduction and removal of semiconductor wafers to be placed in the recesses 16a–h of the susceptor 14, a plurality of inlets 22 (of which only one is shown) for the admission of gaseous reagents as defined above, and a pipe 24 for the expulsion of reacted gaseous products. The reaction chamber 12 is immersed in a pool 26 filled with a mass of water 28 which enters from inlet pipes 30a, 30b, 30c 30d, rises following paths indicated by arrows 32a, 32b and 34a, 34b over barriers 36 and 38 for determining the level and falls into a lower collecting pool 40 which it leaves through discharge pipes 42 and 44.

Alternatively, the reaction chamber 12 may be cooled at the top by a set of nozzles sprinkling cooling water in a shower which finally falls into the lower pool 40.

The pool 26 is formed essentially by a base 46, and by side walls 48, 50, and 53, 54 for holding a sufficient quantity of water. The first two side walls 48 and 50 define supports for the reaction chamber 12 which projects beyond the supports and has flanges 56, 58 welded to the chamber 12 and facing and engaging, by means of respective pairs of seals 64 and 66, corresponding flanges 60 and 62 associated, respectively, with the door 20 for the introduction and removal of wafers and with the pipe 24 for the expulsion of reacted gaseous products. Further seals 68 and 70 ensure watertightness between the flanges 56 and 58 of the chamber and the pool walls 48 and 50. The side walls 48 and 50 of the pool 26 bear on supports 72 and 74 anchored in brackets 76 and 78, and the side walls 52 and 54 bear on brackets 80 and 82.

The pool 26 is closed at the top by a cover 84 for preventing accidental contamination of the mass of water 28 which has to remain substantially pure since the use of demineralized water is preferred. The level barriers 36 and 38 cooperate with lower dividers 86 and 88 on which they are engaged to determine the level of the mass of water 28 which may be made to overflow as shown in FIG. 2, or may pass in a controllable manner between the barriers 36 and 38 and the lower dividers 86 and 88 if a lower level of the mass of water 28 is desired.

Under the chamber 12 and immersed in the mass of water 28 is a first or primary inductor 90 which is supplied by an external generator 92 of a medium-frequency alternating current, as defined above, connected to the inductor 90 by means of connecting bars 94 and 96 which extend through bushing insulating and sealing means 98 and 100 in the base 46.

Further details of the first inductor 90 can be found in FIG. 3 in which this inductor is shown as a flat spiral formed by a series of bar-like conductors bent to form respective circles 90*a–h* connected to one another by flexible bridges 91*a–g* so that an electric current circulating in the inductor 90 passes through all of the circles 90*a–h* shown.

Under the primary inductor 90 and anchored firmly thereto there may be a second or secondary inductor 102 which is kept separated from the primary inductor 90 by means of insulating elements 104 which are present at least where insulating anchoring bands 106 mechanically interconnect the two inductors, as can be seen in particular in FIG. 5.

This secondary inductor 102 is shown in greater detail in FIG. 4 to which reference should be made. Like the primary inductor 90, the secondary inductor 102 also conforms approximately to a flat spiral formed by a series of concentric circular turns 102*a–h* which are not interconnected, however, but are connected to the exterior by means of bar-like conductors 108*a–h* and 110*a–h* which emerge from the base 46 of the tank 26 through sealing bushing insulators 112*a–h* and 114*a–h*.

As already stated, the turns 102*a–h* of the secondary inductor 102 are made of a conductive material having resistivity which is certainly greater than that of the turns of the primary inductor 90, such as, for example Constantan, so as to ensure a correct resistive load simply by the closure of each turn 102*a–h* and, at the same time, an effective dissipation of thermal energy which takes place in the same turn which is in intimate contact with the mass of water 28.

As shown in FIG. 1 and in FIG. 6, the distance between each individual turn 90*a–h* of the inductor 90 and the susceptor 14 is regulated by drive means 118 consisting of controlled motors 120 acting through suitable means capable of carrying out linear movements in alternate directions of graduated rods 122 which are connected to insulating rods 124 inserted in the tank 26 through holes with bellows 126 and fixed to the assembly of turns 90*a–h* and 102*a–h* of the primary and secondary inductors 90 and 102 by means of insulating elements 105 and anchoring clips 107. The graduated rods 122 constitute encoders read by suitable optical sensors 128 which send position signals relating to the individual turns of the inductors 90 and 102 to a member for the general control of the reactor, such as a programmed logic controller (PLC) 130.

The ends of each secondary turn 102*a–h,* which is kept separated from the corresponding primary turn 90*a–h* by an insulating element 104, are fixed together and to the primary turn 90*a–h* by insulating bands and are kept separated by a last insulating member 116.

The susceptor disc 14 is connected for rotation, by means of a screw 132, to a shaft 134 which extends downwardly through a neck 136 of the chamber 12 towards a bellows unit 138 completed by a sliding seal 140 towards the interior of the chamber 12 and is driven by a shaft 142 of a motor 144 controlled by the PLC 130. The bellows unit 138 is positioned correctly by a motor 146 which actuates a graduated encoder rod 148 read by an optical sensor 150 which informs the PLC 130 of the position adopted by the disc 14 relative to the chamber 12 and to the set of inductors 90 and 102.

Sealing between the tank 26 and the chamber neck 136 is achieved by an assembly of a flange 152 and a seal 154, the flange assembly 152 bearing on a support 156 which also supports the drive means 118, and the contacts 158 connected to the individual turns 102*a–h* of the secondary inductor 102.

In order to render the temperature of the wafers 18*a–h* uniform, techniques are used for reflecting the radiant thermal energy emitted by the susceptor 14 and by the wafers 18*a–h,* by means of a reflective layer which can be produced by deposition, for example, by metallization, on all of the external side walls of the reaction chamber, or with the use of a controllable reflection means 160 which is shown in FIGS. 1, 2 and 8 as being formed by a plurality of flat strips 162*a–r* arranged parallel and close together and made, for example, of copper with a first shiny and highly reflective face treated for permanence, for example, by gilding, and a second highly absorbent and dull face, for example, darkened by chemical or electrochemical oxidation. All of the flat strips 162*a–r* arranged parallel to one another have shafts 164*a–r* on one side for permitting a rotation such as to expose either the first reflective face or the second absorbent face to the susceptor 14, or to achieve any possible intermediate condition. In this second possible solution, a reflective layer is in any case deposited on all of the external walls of the reaction chamber except for the wall facing the susceptor on the side with the wafers, which is left transparent. The shafts 164*a–r* are engaged in supports 166*a–r* and 168*a–r* on a support frame 170, and are connected directly to gears 172*a–r*, 174*a–r* meshed with one another by means of intermediate gears 176*a–q*, 178*a–q* which permit rigorously synchronous rotation of the gears 172*a–r*, of the shafts 164*a–r* associated therewith and, consequently, of the flat strips 162*a–r*. One gear, for example, the gear 172*a,* has an eccentric pin 180 to which is articulated a connecting arm 182 which is pivoted on a rod 184 of a linear actuator 186 which provides for a first face of the strips 162*a–r* to be exposed to the susceptor 14 by a first movement and for the second face of the strips 162*a–r* to be exposed by a second movement.

Naturally, like all of the controllable parts of the reactor 10, the linear actuator 186 is also controlled by the PLC 130.

The appearance of the susceptor 14 may be that of FIG. 9 for a susceptor having four recesses 16*a–d* for housing four wafers 18*a–d* (for example, 200 mm diameter wafers), or that of FIG. 10 for a susceptor with eight recesses 16*a–h* for housing eight wafers 18*a–h*. Each of the two susceptors has a central recess 190 against which a head of the screw 132 bears, the screw being engaged in the underlying shaft 134 in order to rotate the susceptor 14.

The operation of the epitaxial reactor 10 according to invention can easily be understood:

silicon wafers 18*a–h* are loaded into the niches or recesses 16*a–h* of the susceptor 14 through the door 20;

the turns 90*a–h* of the inductor 90 are positioned according to the instructions coming from the PLC 130;

alternatively, contacts 158 connected to the secondary turns 102*a–h* are closed or opened in order to vary locally the electromagnetic fields which the inductor 90 produces in the susceptor 14, thus locally varying the heating in the susceptor and hence in the silicon wafers 19*a–h,* and finally the selection to operate in a reflective-cavity environment or in an open-cavity environment is made simply by orienting the strips 162*a–r* with the reflecting face or the absorbent face facing towards the susceptor 14.

The foregoing description describes a preferred embodiment of the present invention which should not be considered absolutely limiting, and similar and logically equivalent solutions, all of which should be considered protected hereby, may occur to those skilled in this particular art from a reading of the foregoing description.

For example, the synchronous movement of the strips 162*a–r* may be carried out by crank means connected to each shaft for rotating a strip and driven by a rod, rather than being carried out by the gears 172*a–r.*

We claim:

1. An improved epitaxial reactor comprising a flat disc-shaped susceptor (14) having a plurality of seats (16) for wafers (18) of material to be processed, housed in a reaction chamber (12) having the form of a flattened tube having two larger walls disposed substantially parallel to the end faces of the disc-shaped susceptor (14), the susceptor rotating about its principal axis and being heated by induction by an inductor (90), wherein: the inductor (90) is as close as possible to the susceptor (14), is located outside the reaction chamber (12), is constituted by a flat spiral parallel to an end face of the susceptor (14), is constituted by a plurality of concentric circular flat turns connected in series to form a shape similar to a flat spiral and is cooled by means of externally circulating fluid.

2. An improved epitaxial reactor according to claim 1, wherein the reaction chamber is cooled by immersion in coolant fluid, and the inductor is cooled by the coolant fluid and is completely immersed in the coolant fluid.

3. An improved epitaxial reactor according to claim 1, wherein the susceptor (14) has a slight inclination to the reaction chamber (12).

4. An improved epitaxial reactor according to claim 1, wherein the disc-shaped susceptor is of uniform thickness.

5. An improved epitaxial reactor according to claim 1, wherein the thickness of the disc-shaped susceptor is variable from point to point.

6. An improved epitaxial reactor according to claim 1, wherein the reaction chamber (12) is cooled by a shower of coolant fluid (28) and the inductor (90) is cooled by the same coolant fluid which enters as a shower and is collected in a pool (26) disposed beneath the reaction chamber (12).

7. An improved epitaxial reactor according to claim 1 wherein the reaction chamber (12) is cooled by air circulation and in that the inductor (90), which is formed by solid conductors, is cooled by immersion in a mass (28) of flowing water.

8. An improved epitaxial reactor according to claim 1, wherein the inductor (90) is formed by hollow conductors enabling coolant fluid to circulate inside them.

9. An improved epitaxial reactor according to claim 1, wherein the inductor (90) is supported by mobile supports (126) which can be actuated by mobile drive means (118) to enable the distance between the inductor (90) and the susceptor (14) to be controlled, the actuation being detected by encoders (122) connected to the drive means (118).

10. An improved epitaxial reactor according to claim 1 wherein the mobile supports (126) actuated by drive means (118) act separately on each individual turn (90a–h) of the inductor (90) enabling the distance between each individual turn (90a–h) and the susceptor (14) disposed above it to be controlled separately so as consequently to control the currents induced in the susceptor (14) by altering the distance between the turns (90a–h) and the susceptor (14).

11. An improved epitaxial reactor according to claim 9, wherein the individual turns (90a–h) of the inductor (90) have taps for external connection to control members in order to draw current from the individual turns or to admit current to the individual turns.

12. An improved epitaxial reactor according to claim 11, wherein the control members connectable to the taps are variable inductors for the regulable drawing of current from the turns 990a–h) or variable capacitors for the regulable admission of current to the turns (90a–h).

13. An improved epitaxial reactor according to claim 1, wherein a secondary coil (102) is coupled closely to the primary inductor coil (90) and consists of concentric circular turns (102a–h) which are anchored tightly to the individual turns (90a–h) of the inductor (90) and each of which terminates in connections (180a–h, 110a–h) to external members for connecting the individual turns to current regulators.

14. An improved epitaxial reactor according to claim 13, wherein the turns (102a–h) of the secondary coil (102) which are anchored tightly to the turns (0a–h) of the primary inductor coil (90) are made of conductive material having a different resistivity from that of the conductors of the primary coil (90) so as to act as resistive loads when the turns (102a–h) are closed.

15. An improved epitaxial reactor according to claim 14, wherein the turns of the primary coil (90) are made of solid copper conductors and the turns of the secondary coil (102) are made of conductors of Constantan or similar materials with high resistivity.

16. An improved epitaxial reactor according to claim 15, wherein thermal energy radiated by the hot susceptor (14) is reflected by means of reflective layers such as gold or other metals with high coefficients of reflection mainly within the infrared wavelength range between 0.5 and 5 microns and deposited on all of the external walls of the reaction chamber.

17. An improved epitaxial reactor according to claim 16, further comprising means for controlling the reflection of the thermal energy radiated by the susceptor (14), said means is located above the reaction chamber (12), facing the susceptor (14) on the side housing the wafers (18a0h) under treatment, of a movable reflective layer (160) which is adjustable to increase or decrease reflection, a reflective layer deposited on all of the walls facing the susceptor (14) which is left transparent to permit reflection by means of the movable reflective layer (160).

18. An improved epitaxial reactor according to claim 17, wherein the reflective layer (160) consists of a series of parallel strips (162a–r) arranged like the slats of a blind, bearing a highly reflective shiny surface on one side and a highly absorbent dull surface on the other side so as to reflect the thermal radiation when the reflective faces of the strips (162a–r) are turned towards the susceptor (14) and to dissipate the thermal radiation when the absorbent faces of the strips (162a–r) are turned towards the susceptor (14).

19. An improved epitaxial reactor according to claim 18, wherein the aforesaid strips (162a–r) consist of metal strips gilded on one face and darkened on the other so as to reflect with the gilded face and absorb with the darkened face.

20. An improved epitaxial reactor according to claim 19, wherein the strips (162a–r) consist of strips of copper sheet gilded on one side and darkened by oxidation on the opposite side, the gilding and the darkening possibly being achieved by chemical methods.

21. An improved epitaxial reactor according to claim 20, wherein both the gilding and the darkening by oxidation are achieved electrolytically.

22. An improved epitaxial reactor according to claim 17, wherein the strips (162a–r) may be of anodized aluminium with one shiny face and one dull darkened face.

23. An improved epitaxial reactor according to claim 17, wherein the aforesaid strips (162a–r) with shiny reflective faces and dull darkened faces are actuated by a mechanism (186) which permits exposure of the reflective faces or of the darkened faces or adjustment to intermediate positions.

24. An improved epitaxial reactor according to claim 23, wherein the mechanism consists of rotary shafts (164a–r) which are inserted in the strips (162a–r) and which enable either one face or the opposite face of the strips (162a–r) to be exposed.

25. An improved epitaxial reactor according to claim 24, wherein a unison mechanism is provided for enabling all of the strips (162a–r) to move simultaneously.

26. An improved epitaxial reactor according to claim 25, wherein the unison mechanism consists of a series of gears (172a–r, 174a–r) each of which is connected to a shaft (164a–r) for rotating a strip (162a–r) and which are meshed with one another to permit simultaneous positioning of the strips (162a–r) on the desired side.

27. An improved epitaxial reactor according to claim 25, wherein the unison mechanism consists of crank means which are connected to each shaft (164a–r) for rotating a strip (162a–r) and are moved by a rod which connects all of the cranks.

28. An improved epitaxial reactor according to claim 25, wherein the strips (162a–r) are moved by a rotary actuator connected to the mechanism for moving the strips (162a–r) in unison.

29. An improved epitaxial reactor according to claim 25, wherein the actuator (186) includes means for reciprocating linear movement.

30. An improved epitaxial reactor according to claim 1, wherein a programmable logic controller (130) is used to control the circulation of the coolant fluid (28), the spacing of the inductor (90) from the susceptor (14), the connection of taps of the inductor to external current-regulating members, or the connection of taps of the secondary coil (102) to external current regulating members or to contacts (158), and the positioning of the actuator (186) of the strips (162a–r) with the reflecting or absorbent layer.

31. An improved epitaxial reactor according to claim 2, wherein the coolant fluid is water flowing through a pool.

* * * * *